(12) United States Patent
Guillorn et al.

(10) Patent No.: US 10,153,340 B2
(45) Date of Patent: *Dec. 11, 2018

(54) STACKED NANOWIRE SEMICONDUCTOR DEVICE

(71) Applicant: INTERNATIONAL BUSINESS MACHINES CORPORATION, Armonk, NY (US)

(72) Inventors: Michael A. Guillorn, Cold Springs, NY (US); William L. Nicoll, Pleasant Valley, NY (US); Hanfei Wang, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/396,842

(22) Filed: Jan. 3, 2017

(65) Prior Publication Data
US 2017/0194431 A1  Jul. 6, 2017

Related U.S. Application Data

(63) Continuation of application No. 14/988,083, filed on Jan. 5, 2016, now Pat. No. 9,570,550.

(51) Int. Cl.
*H01L 29/06* (2006.01)
*H01L 29/417* (2006.01)
(Continued)

(52) U.S. Cl.
CPC .... *H01L 29/0673* (2013.01); *H01L 21/02532* (2013.01); *H01L 29/41733* (2013.01);
(Continued)

(58) Field of Classification Search
CPC ........... H01L 29/0673; H01L 29/66871; H01L 29/413; H01L 29/0669; H01L 2221/1094;
(Continued)

(56) References Cited

U.S. PATENT DOCUMENTS

| 9,559,013 B1 * | 1/2017 | Balakrishnan ............................... H01L 21/823814 |
| 2015/0243733 A1 * | 8/2015 | Yang .................... H01L 29/0673 257/401 |

(Continued)

OTHER PUBLICATIONS

List of IBM Patents or Patent Applications Treated as Related; (Appendix P), Filed Jan. 13, 2017; 2 pgs.
(Continued)

*Primary Examiner* — David Spalla
(74) *Attorney, Agent, or Firm* — Cantor Colburn LLP; Steven Meyers

(57) ABSTRACT

A method for forming a semiconductor device comprising forming a stack of nanowires, the stack including a first nanowire having a first length, and a second nanowire having a second length, the second nanowire arranged above the first nanowire, forming a sacrificial gate stack on the stack of nanowires, growing a source/drain region on the first, second nanowires, removing the sacrificial gate stack to expose channel regions of the first and second nanowires, and forming a gate stack over the channel regions.

5 Claims, 15 Drawing Sheets

(51) Int. Cl.
*H01L 29/423* (2006.01)
*H01L 29/66* (2006.01)
*H01L 29/786* (2006.01)
*H01L 21/02* (2006.01)
*H01L 29/78* (2006.01)

(52) U.S. Cl.
CPC .... *H01L 29/42384* (2013.01); *H01L 29/6653* (2013.01); *H01L 29/66545* (2013.01); *H01L 29/66795* (2013.01); *H01L 29/785* (2013.01); *H01L 29/78696* (2013.01); *H01L 29/42392* (2013.01); *H01L 29/78618* (2013.01)

(58) Field of Classification Search
CPC ....... H01L 21/02603; H01L 21/823418; H01L 29/0843; H01L 29/0847; H01L 29/41725; H01L 29/41733; H01L 29/41783; H01L 29/78618
See application file for complete search history.

(56) References Cited

U.S. PATENT DOCUMENTS

2015/0303313 A1* 10/2015 Mallela ............. H01L 21/28291
    327/543
2017/0053998 A1* 2/2017 Kim .................. H01L 29/42392

OTHER PUBLICATIONS

Michael A. Guillorn et al., "Stacked Nanowire Semiconductor Device," U.S. Appl. No. 14/988,083, filed Jan. 5, 2016.
Michael A. Guillorn et al., "Stacked Nanowire Semiconductor Device," U.S. Appl. No. 15/177,483, filed Jun. 9, 2016.
Michael A. Guillorn et al., "Stacked Nanowire Semiconductor Device," Related Application, U.S. Appl. No. 16/050,527, filed Jul. 31, 2018.
List of IBM Patents or Patent Applications Treated As Related; (Appendix P) filed Jul. 31, 2018; pp. 1-2.

* cited by examiner

STACKED NANOWIRE SEMICONDUCTOR DEVICE

DOMESTIC PRIORITY

This application is a continuation application of the legally related U.S. Ser. No. 14/988,083 filed Jan. 5, 2016, the contents of which are incorporated by reference herein in their entirety.

BACKGROUND

The present invention relates to semiconductor, and more specifically, to gate all around nanowire semiconductor devices.

The MOSFET is a transistor used for amplifying or switching electronic signals. The MOSFET has a source, a drain, and a metal oxide gate electrode. The metal gate is electrically insulated from the main semiconductor n-channel or p-channel by a thin layer of insulating material, for example, silicon dioxide or glass, which makes the input resistance of the MOSFET relatively high. The gate voltage controls whether the path from drain to source is an open circuit ("off") or a resistive path ("on").

N-type field effect transistors (NFET) and p-type field effect transistors (PFET) are two types of complementary MOSFETs. The NFET uses electrons as the current carriers and with n-doped source and drain junctions. The PFET uses holes as the current carriers and with p-doped source and drain junctions.

The nanowire MOSFET is a type of MOSFET with multiple-gates or gates all around a channel region of the semiconductor nanowire. The nanowire MOSFET device mitigates the effects of short channels and reduces drain-induced barrier lowering. The nanowire refers to the narrow channel between source and drain regions.

SUMMARY

According to an embodiment of the present invention, a method for forming a semiconductor device comprising forming a stack of nanowires, the stack including a first nanowire having a first length, and a second nanowire having a second length, the second nanowire arranged above the first nanowire, forming a sacrificial gate stack on the stack of nanowires, growing a source/drain region on the first, second nanowires, removing the sacrificial gate stack to expose channel regions of the first and second nanowires, and forming a gate stack over the channel regions.

According to another embodiment of the present invention, a method for forming a semiconductor device comprises forming a stack of nanowires, the stack includes a first nanowire having a first length, and a second nanowire having a second length, the second nanowire arranged above the first nanowire, growing a source/drain region on the first and second nanowires, and forming a gate stack over channel regions of the first and second nanowires.

According to yet another embodiment of the present invention, a semiconductor device comprises a stack of nanowires, the stack includes a first nanowire having a first length, a second nanowire having a second length, the second nanowire arranged above the first nanowire, and a third nanowire having a third length, the third nanowire arranged above the second nanowire, and a gate stack arranged over channel regions of the first nanowire, the second nanowire, and the third nanowire.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 1 illustrates a side view of an exemplary substrate.

FIG. 2 illustrates a top view of the stack following a lithographic patterning and etching process.

FIG. 3 illustrates a side view following the formation of a sacrificial gate stack over the stack.

FIG. 4 illustrates a top view of the sacrificial gate stack arranged over the nanowire stack and the substrate.

FIG. 5 illustrates a side view following the formation of spacers adjacent to the sacrificial gate stack.

FIG. 6 illustrates a top view of the spacers arranged adjacent to the sacrificial gate stack.

FIG. 7 illustrates a side view following the patterning of a hard mask.

FIG. 8 illustrates a top view of the hardmask.

FIG. 9 illustrates a side view following a selective anisotropic etching process.

FIG. 10 illustrates a side view following a "pull back" of the hardmask.

FIG. 11 illustrates a side view following a selective etching process

FIG. 12 illustrates a side view of the resultant structure following a selective etching process.

FIG. 13 illustrates a side view of the resultant structure following a selective isotropic etching process.

FIG. 14 illustrates a side view of the resultant structure following an etching process that removes the spacers.

FIG. 15 illustrates a side view following the formation of a second set of spacers.

FIG. 16 illustrates a side view following the formation of source/drain regions.

FIG. 17 illustrates the formation of an insulator layer.

FIG. 18 illustrates a side view following the removal of the sacrificial gate stack.

FIG. 19 illustrates the resultant structure following the formation of a gate stack.

FIG. 20 illustrates a side view of the resultant structure following the formation of conductive contacts.

FIG. 21 illustrates a side view that includes a sacrificial gate stack arranged on the substrate and nanowires having staggered lengths arranged in a stack.

FIG. 22 illustrates the resultant structure following the deposition of a spacer material.

FIG. 23 illustrates a side view of the resultant structure following an etching process and epitaxial source/drain growth.

FIG. 24 illustrates a side view of a structure similar to the structure shown and described in FIG. 22.

FIG. 25 illustrates the resultant structure following the patterning of a mask.

FIG. 26 illustrates a side view following the removal of the mask and the growth of source/drain regions.

FIG. 27 illustrates the formation of a protective and sacrificial layer.

FIG. 28 illustrates a side view following the patterning of a mask.

FIG. 29 illustrates a side view following the removal of the mask and epitaxial growth of a second source/drain contact.

FIG. 30 illustrates a side view of the resultant structure following the formation of source/drain regions.

DETAILED DESCRIPTION

Nanowire or gate all around semiconductor devices improve the performance of smaller field effect transistor devices. As semiconductor devices become smaller, it becomes more challenging to fit more devices on a substrate. Thus, stacking the nanowires to create stacked nanowire FET devices increases the density of FET devices on a substrate. As the devices become smaller, the source/drain regions become smaller, and resistance due to the decreasing size of the contacts undesirably increases.

The methods and resultant structures described herein provide for greater surface area in the source/drain regions of stacked nanowire FET devices by staggering the lengths of the stacked nanowires in the source/drain regions of the devices.

FIGS. 1-20 illustrate an exemplary method and resultant semiconductor device.

Figure 1:
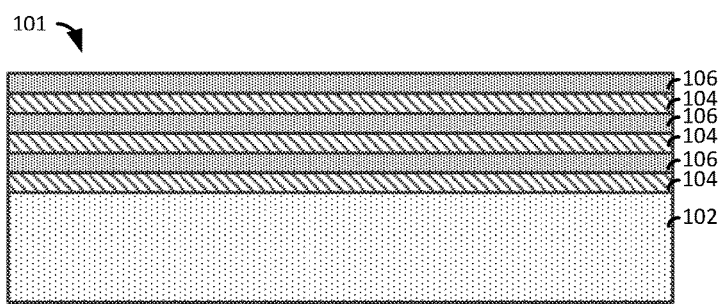
FIGS. 1-20 illustrate an exemplary method and resultant semiconductor device.

FIG. 1 illustrates a side view of an exemplary substrate 102. Non-limiting examples of suitable substrate materials include Si (silicon), strained Si, SiC (silicon carbide), Ge (geranium), SiGe (silicon germanium), SiGeC (silicon-germanium-carbon), Si alloys, Ge alloys, GaAs (gallium arsenide), InAs (indium arsenide), InP (indium phosphide), or any combination thereof. Other examples of suitable substrates include silicon-on-insulator (SOI) substrates with buried oxide (BOX) layers.

An alternating stack 101 of a layer of a first semiconductor material 104 and a layer of a second semiconductor material 106 is arranged on the substrate 102. The first semiconductor material 104 and the second semiconductor material 106 are formed from dissimilar materials. In the illustrated embodiment, the first semiconductor material 104 includes a SiGe material, while the second semiconductor material 106 includes a Si material. However, any suitable materials may be used for the first semiconductor material 104 and the second semiconductor material 106.

Figure 2:
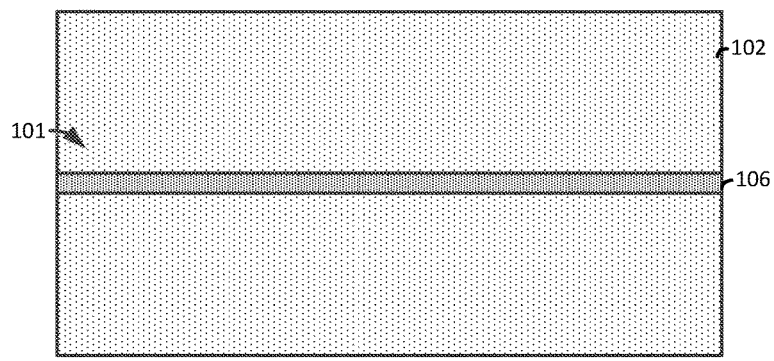

FIG. 2 illustrates a top view of the stack 101 following a lithographic patterning and etching process such as, for example, reactive ion etching that removes portions of the stack 101 to define a nanowire stack 202.

Figure 3:
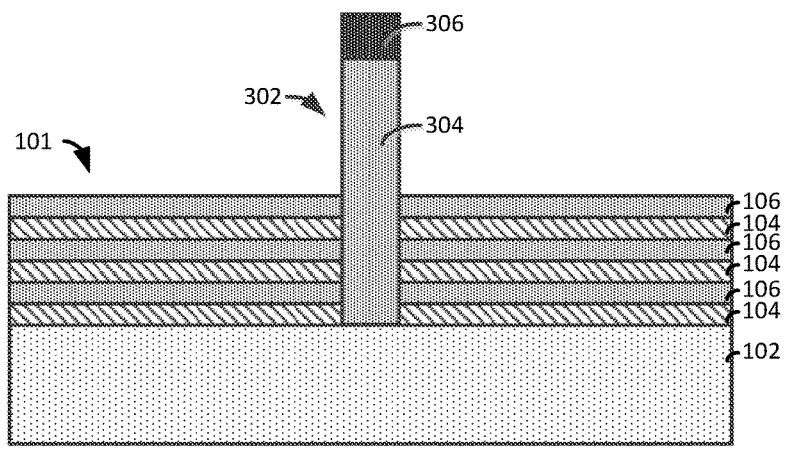

FIG. 3 illustrates a side view following the formation of a sacrificial gate stack 302 over the stack 202. The sacrificial gate stack 302 includes a layer of polysilicon or amorphous silicon 302 and a hardmask layer 306.

Figure 4:
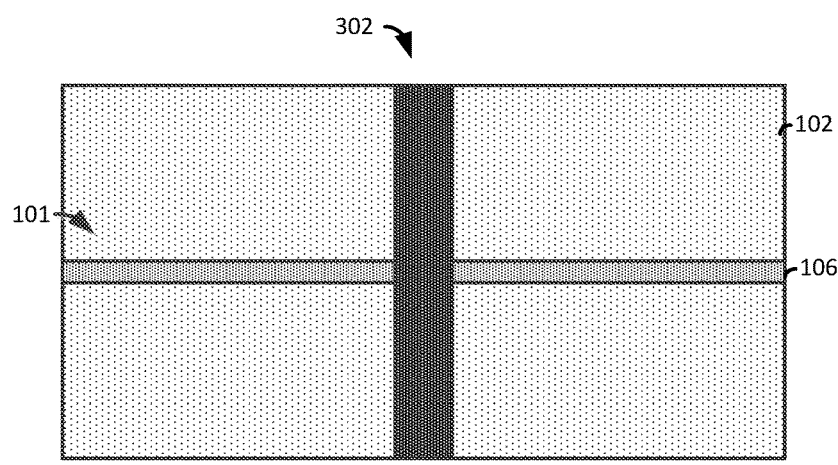

FIG. 4 illustrates a top view of the sacrificial gate stack 302 arranged over the nanowire stack 202 and the substrate 102.

Figure 5:
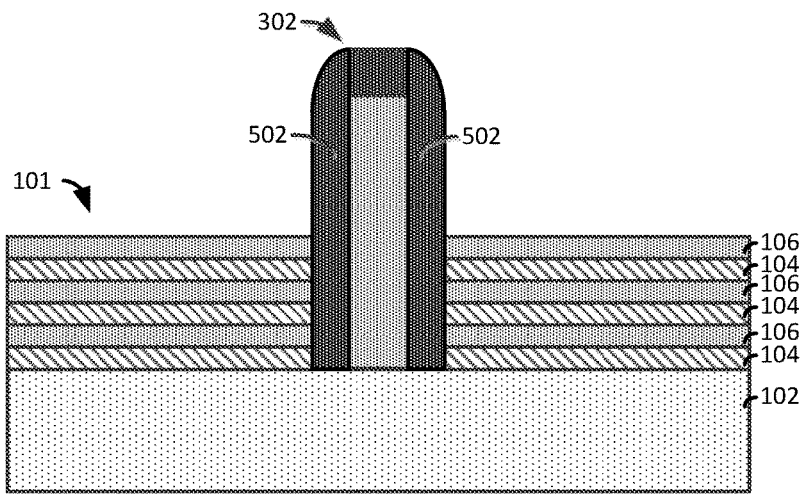

FIG. 5 illustrates a side view following the formation of spacers 502 adjacent to the sacrificial gate stack 302. The spacers 502 may be formed by, for example, depositing a layer of nitride or oxide material over the sacrificial gate stack and performing an anisotropic etching process such as reactive ion etching to form the spacers 502.

Figure 6:
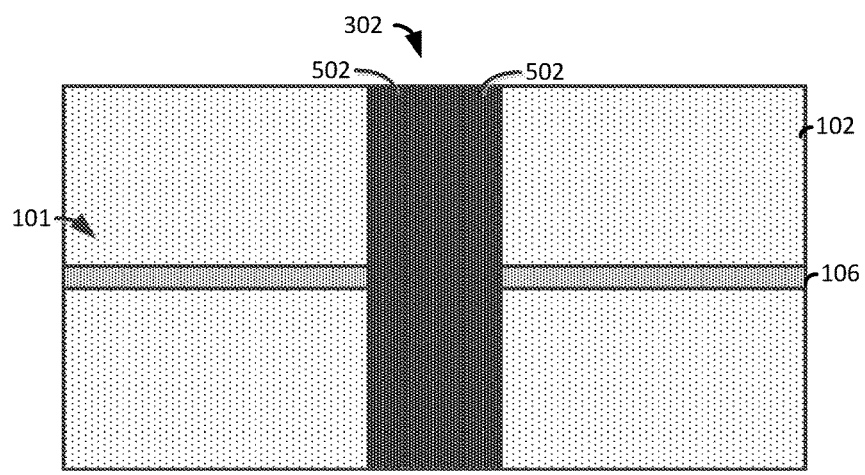

FIG. 6 illustrates a top view of the spacers 502 arranged adjacent to the sacrificial gate stack 302.

Figure 7:
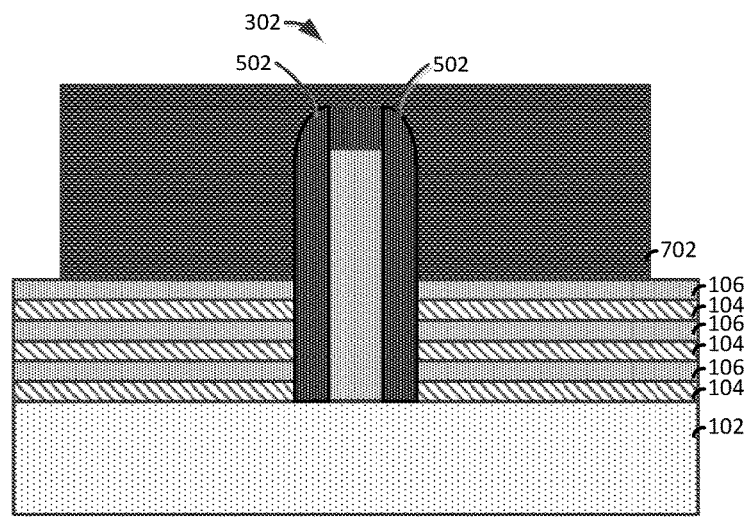

FIG. 7 illustrates a side view following the patterning of a masking layer 702 over portions of the substrate 102, the nanowire stack 202, and the sacrificial gate stack 302. The masking material may be made from an organic planarizing layer or other spin-on material with suitable etch resistance.

Figure 8:
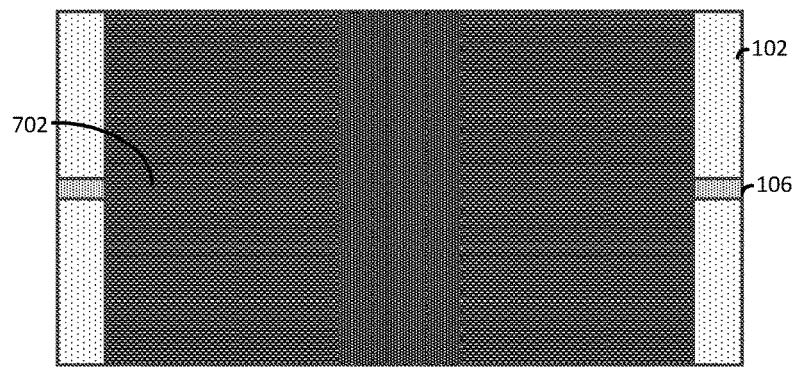

FIG. 8 illustrates a top view of the masking layer 702.

Figure 9:
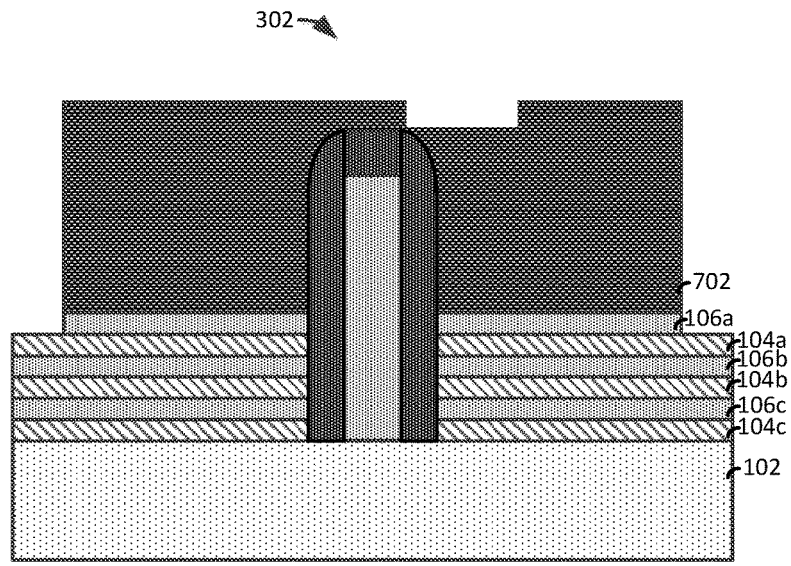

FIG. 9 illustrates a side view following a selective anisotropic etching process, such as, for example reactive ion etching that removes exposed portions of the second semiconductor layer 106a.

Figure 10:
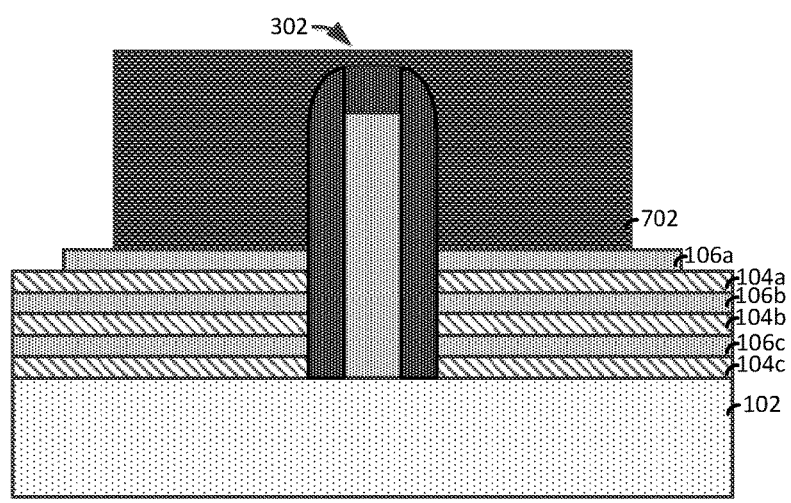

FIG. 10 illustrates a side view following a "pull back" of the masking layer 702 to expose another portion of the second semiconductor layer 106a.

Figure 11:
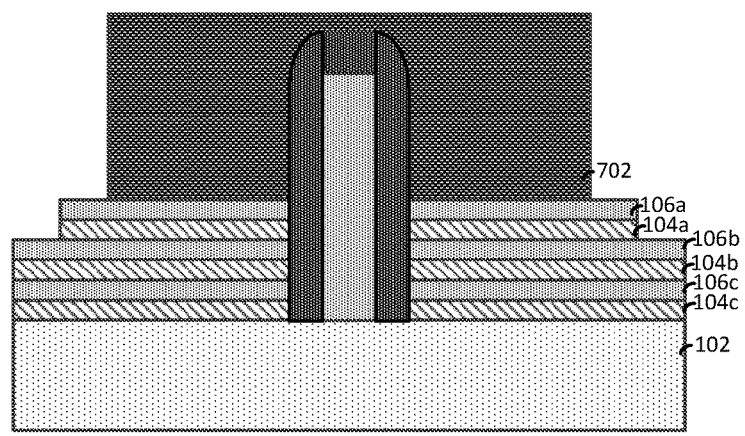

FIG. 11 illustrates a side view following a selective etching process such as, for example reactive ion etching that removes exposed portions of the first semiconductor layer 104a and exposes portions of the second semiconductor layer 106b.

Figure 12:
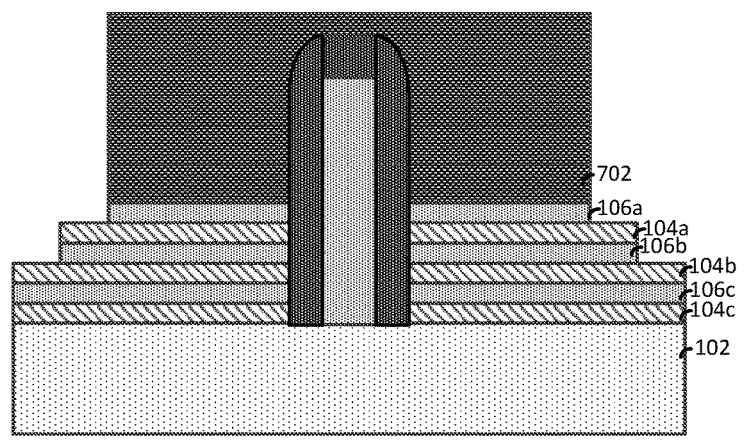

FIG. 12 illustrates a side view of the resultant structure following a selective etching process that removes exposed portions of the second semiconductor layers 106a and 106b and exposes portions of the first semiconductor layers 104a and 104b.

Figure 13:
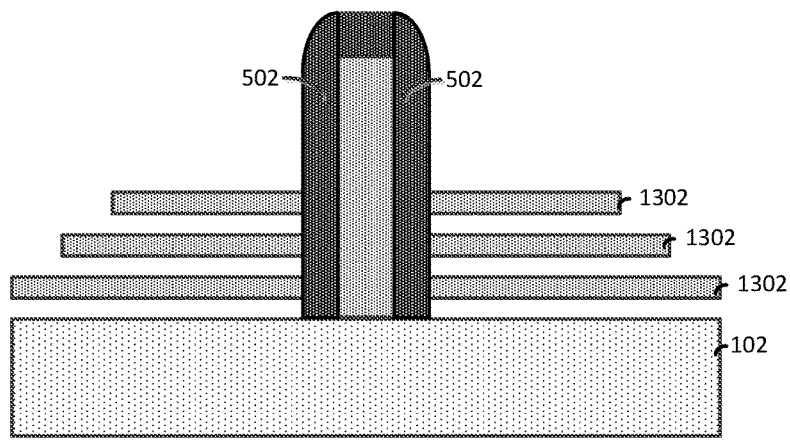

FIG. 13 illustrates a side view of the resultant structure following a selective isotropic etching process that undercuts the second semiconductor layers 106 (of FIG. 12) by removing the first semiconductor layers 104 resulting in the nanowires 1302.

Figure 14:
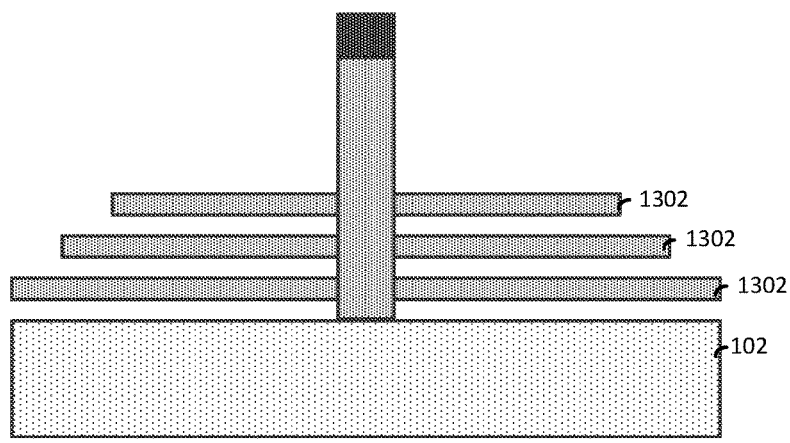

FIG. 14 illustrates a side view of the resultant structure following an etching process that removes the spacers 502 (of FIG. 13) using a selective etching process such as, for example, reactive ion etching or wet etching.

Figure 15:
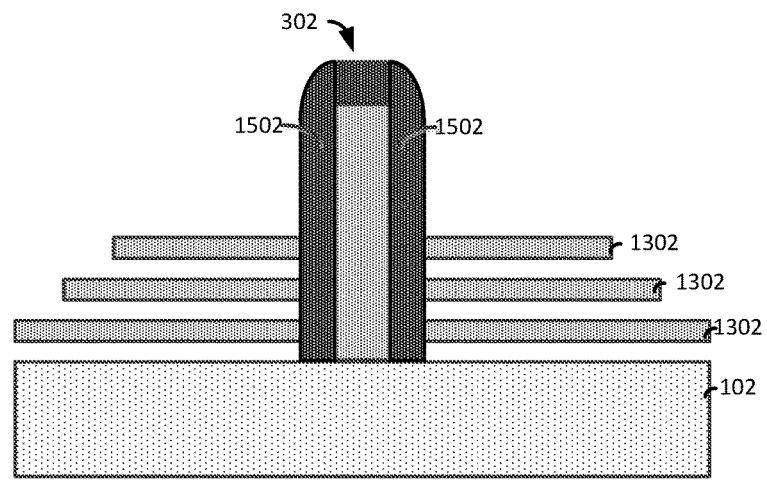

FIG. 15 illustrates a side view following the formation of a second set of spacers 1502 adjacent to the sacrificial gate stack 302. The second set of spacers 1502 fills or obscures open regions left by the removal of the first semiconductor layers 104.

Figure 16:
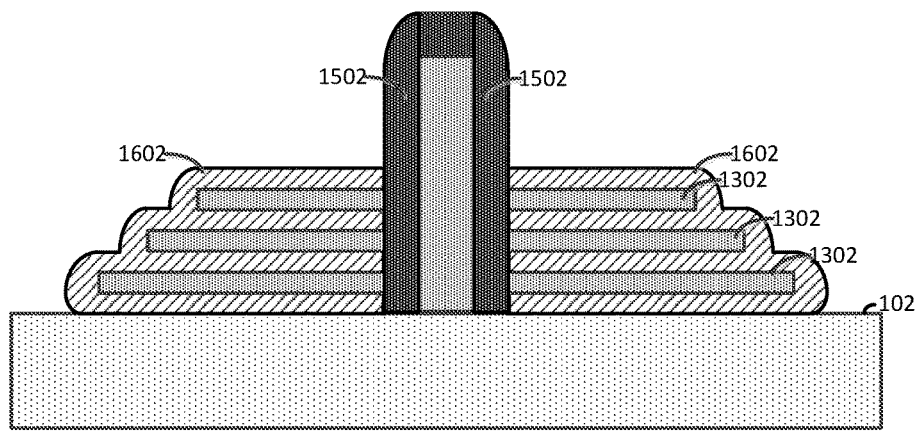

FIG. 16 illustrates a side view following the formation of source/drain regions 1602 over exposed portions of the nanowires 1302 using an epitaxial growth process. In this regard, an epitaxial growth process is performed to deposit a crystalline layer onto a crystalline material beneath. The underlying material acts as a seed crystal. Epitaxial layers may be grown from gaseous or liquid precursors. Epitaxial silicon may be grown using vapor-phase epitaxy (VPE), molecular-beam epitaxy (MBE), liquid-phase epitaxy (LPE), or other suitable process. The epitaxial silicon, silicon germanium, and/or carbon doped silicon (Si:C) silicon can be doped during deposition by adding a dopant or impurity to form a silicide. The silicon may be doped with an n-type dopant (e.g., phosphorus or arsenic) or a p-type dopant (e.g., boron or gallium), depending on the type of transistor.

A silicide (not shown) may be formed on the source/drain regions 1602. A metal silicide film is formed on the source/drain regions 1602 by performing a thermal treatment to a metallic film. The metallic film can be deposited by performing an evaporation process or a sputtering process. The metallic film is annealed by heating inside a furnace or performing a rapid thermal treatment in an atmosphere containing pure inert gases (e.g., nitrogen or argon) so that the metal reacts with the semiconductor material to form a metal silicide layer. Non-limiting examples of suitable metal silicide materials include titanium silicide, tungsten silicide, cobalt silicide, nickel silicide, molybdenum silicide, platinum silicide, or any combination thereof.

Figure 17:
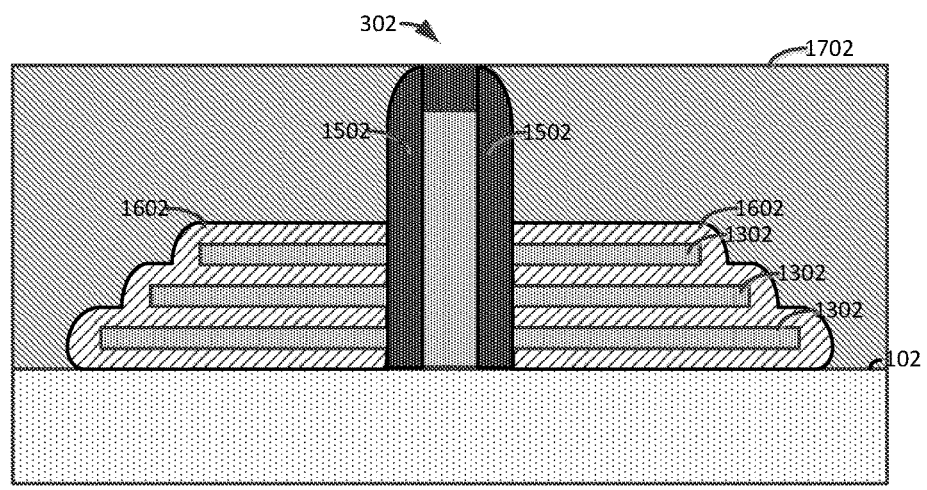

FIG. 17 illustrates the formation of an insulator layer (inter-level dielectric layer (ILD)) 1702. The inter-level dielectric (ILD) layer 1702 may be formed from, for example, a low-k dielectric oxide, including but not limited to, silicon dioxide, spin-on-glass, a flowable oxide, a high density plasma oxide, borophosphosilicate glass (BPSG), or any combination thereof.

The low-k dielectric oxide layer 1702 is deposited by a suitable deposition process, including, but not limited to CVD, PVD, plasma enhanced CVD, atomic layer deposition (ALD), evaporation, chemical solution deposition, or like processes. The ILD layer 1702 may further comprise a liner (e.g., silicon nitride) (not shown) that is deposited before the oxide.

Figure 18:
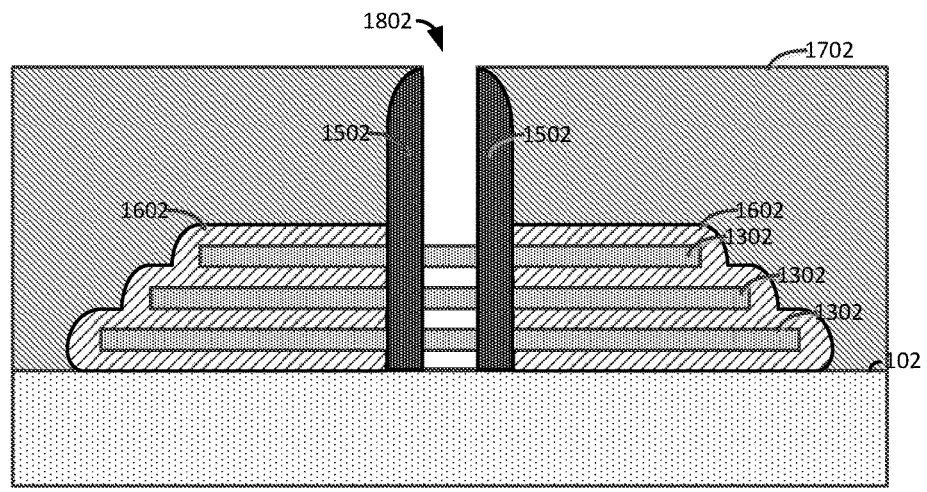

FIG. 18 illustrates a side view following the removal of the sacrificial gate stack 302 (of FIG. 17), which forms a cavity 1802 that exposes channel regions of the nanowires 1302.

Figure 19:
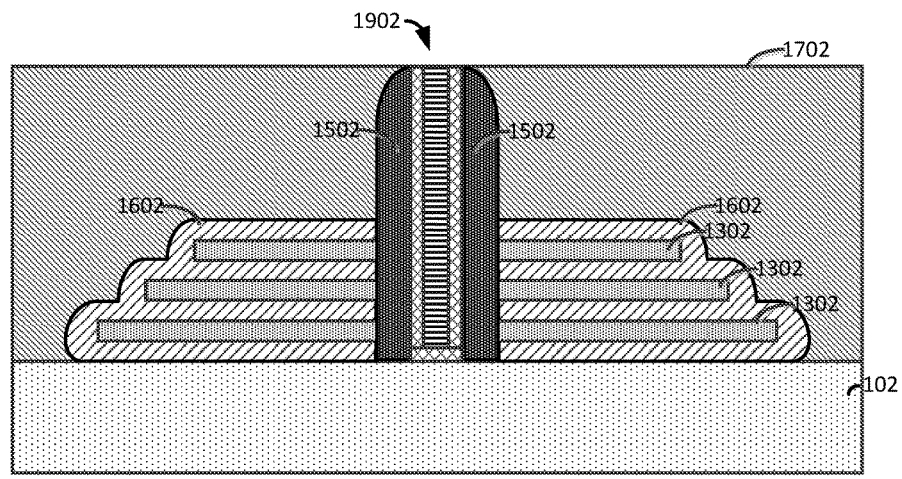

FIG. 19 illustrates the resultant structure following the formation of a gate stack 1902 in the cavity 1802 (of FIG. 18). The gate stack 1902 includes high-k metal gates formed, for example, by filling a cavity 1802 with one or more high-k dielectric materials, one or more workfunction metals, and one or more metal gate conductor materials. The high-k dielectric material(s) can be a dielectric material having a dielectric constant greater than 4.0, 7.0, or 10.0. Non-limiting examples of suitable materials for the high-k dielectric material include oxides, nitrides, oxynitrides, silicates (e.g., metal silicates), aluminates, titanates, nitrides, or any combination thereof. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The high-k dielectric material layer may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the high-k dielectric material may vary depending on the deposition process as well as the composition and number of high-k dielectric materials used. The high-k dielectric material layer may have a thickness in a range from about 0.5 to about 20 nm.

The work function metal(s) may be deposited over the high-k dielectric material. The type of work function metal(s) depends on the type of transistor and may differ between the nFET and the pFET. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof.

A conductive metal is deposited over the high-k dielectric material(s) and workfunction layer(s) to form the gate stacks. Non-limiting examples of suitable conductive metals include aluminum (Al), platinum (Pt), gold (Au), tungsten (W), titanium (Ti), or any combination thereof. The conductive metal may be deposited by a suitable deposition process, for example, CVD, PECVD, PVD, plating, thermal or e-beam evaporation, and sputtering.

A planarization process, for example, chemical mechanical planarization (CMP), is performed to polish the surface of the conductive gate metal.

Figure 20:
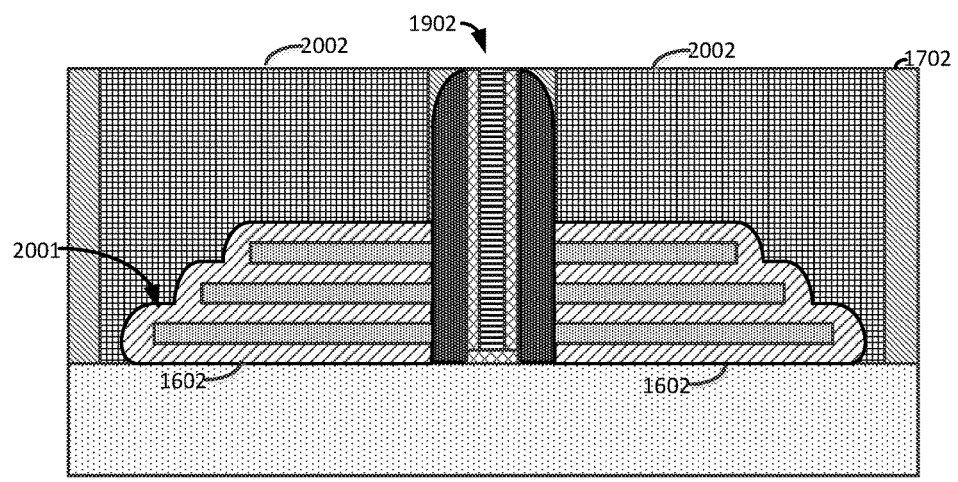

FIG. 20 illustrates a side view of the resultant structure following the formation of conductive contacts 2002 over the source/drain regions 1602. The conductive contacts 2002 may be formed by, for example, removing portions of the ILD layer 1702 to expose the source/drain regions 1602. A liner layer (not shown) may be deposited in the resultant cavity. A conductive material such as, for example, W, Au, Al, or Cu is deposited in the cavity and planarized by, for example, chemical mechanical polishing to define the contacts 2002.

The device shown in FIG. 20 provides for a nanowire FET device having stacked nanowires with different lengths such that the epitaxially grown source/drain region has an increased surface area 2001, which reduces the external resistance of the device.

Figure 21:
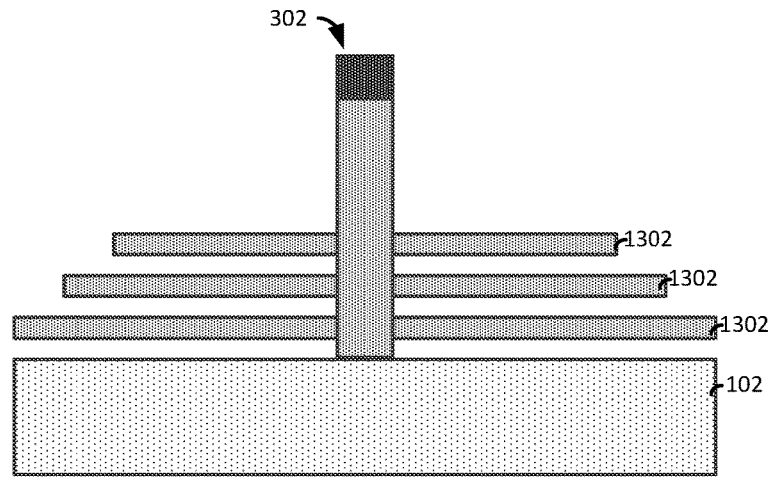
FIGS. 21-23 illustrate another exemplary method for fabricating a stacked nanowire device.
Figure 22:
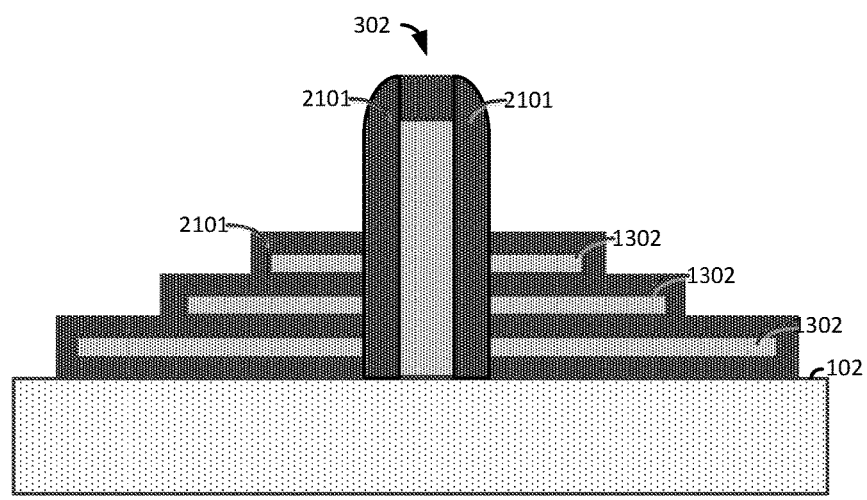
Figure 23:
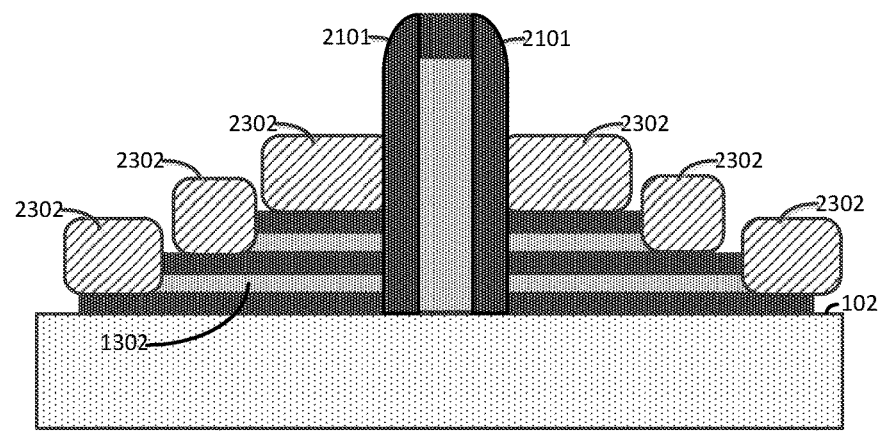

FIGS. 21-23 illustrate another exemplary method for fabricating a stacked nanowire device. FIG. 21 is similar to FIG. 14 described above. The method described in FIGS. 1-14 above may be used to result in the structure shown in FIG. 21, which includes a sacrificial gate stack 302 arranged on the substrate 102 and nanowires 1302 having staggered lengths arranged in a stack.

FIG. 22 illustrates the resultant structure following the deposition of a spacer material 2202 over exposed portions of the nanowires 1302 and adjacent to the sacrificial gate stack 302. The spacer material 2202 may include, for example, a nitride material.

FIG. 23 illustrates a side view of the resultant structure following an etching process such as, for example, reactive ion etching that removes portions of the spacer material 2202 to expose portions of the nanowires 1302. Once portions of the nanowires 1302 have been exposed, an epitaxial growth process is performed to form unmerged source/drain regions 2302.

Following the formation of the source drain regions 2502 similar processes as described above in FIGS. 16-20 may be performed to substantially form a nanowire FET device having unmerged source/drain regions 2502.

FIGS. 24-30 illustrate another exemplary method for fabricating a stacked nanowire device having stacked nFET and pFET devices.

Figure 24:
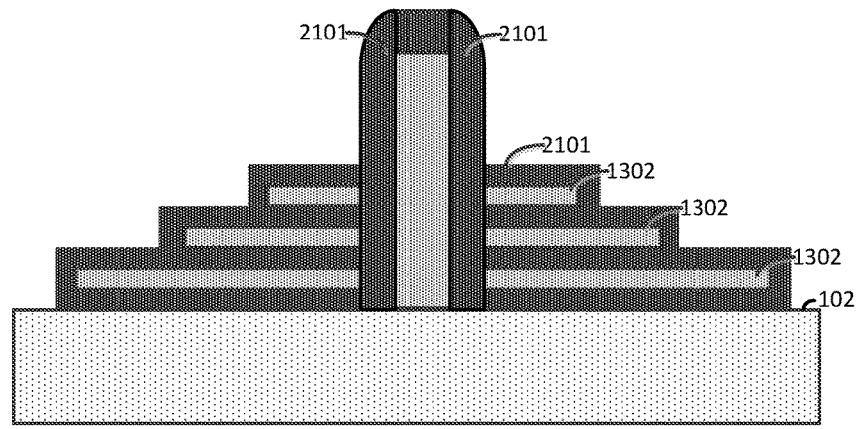
FIGS. 24-30 illustrate another exemplary method for fabricating a stacked nanowire device.

FIG. 24 illustrates a side view of a structure similar to the structure shown and described above in FIG. 22 where a layer of spacer material 2202 has been formed over exposed portions of the nanowires 1302.

Figure 25:
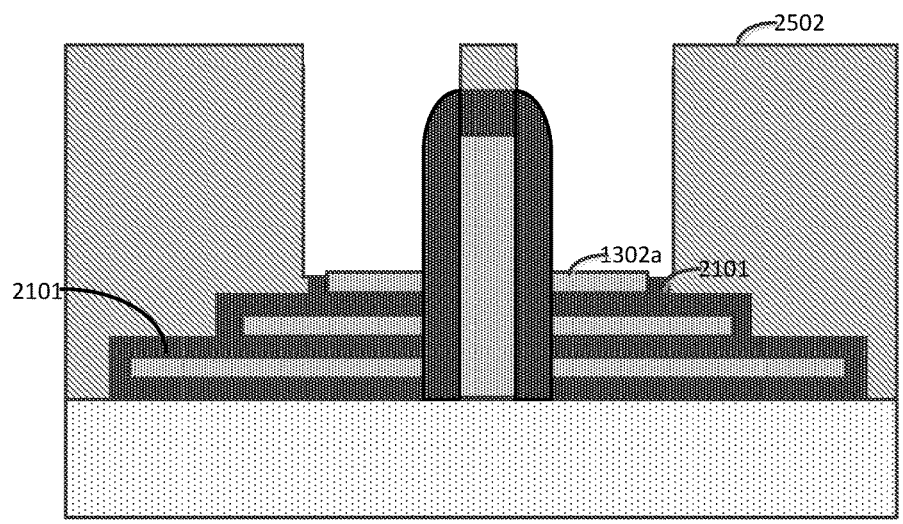

FIG. 25 illustrates the resultant structure following the patterning of a mask 2502 and an etching process such as, for example, reactive ion etching that removes exposed portions of the spacer material 2202 to expose the nanowire 1302a.

Figure 26:
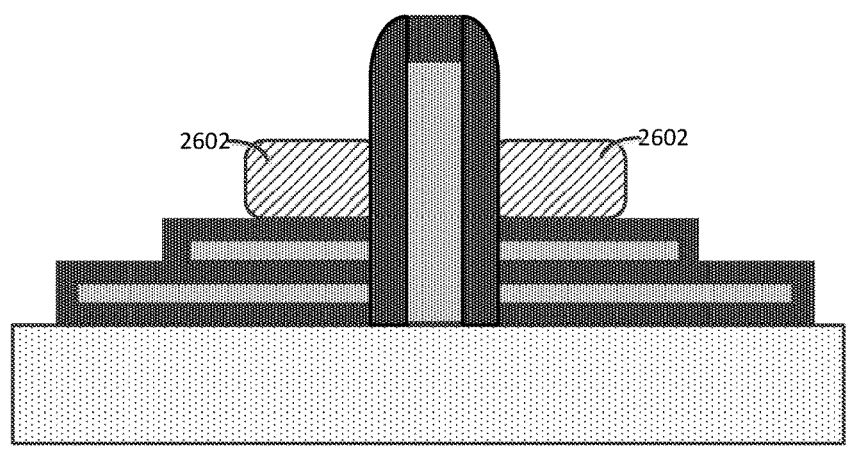

FIG. 26 illustrates a side view following the removal of the mask 2502 (of FIG. 25) and the growth of source/drain regions 2602. The mask may be removed by, for example, an ashing process. The source/drain regions 2602 may be grown by a suitable epitaxial growth process as described above.

Figure 27:
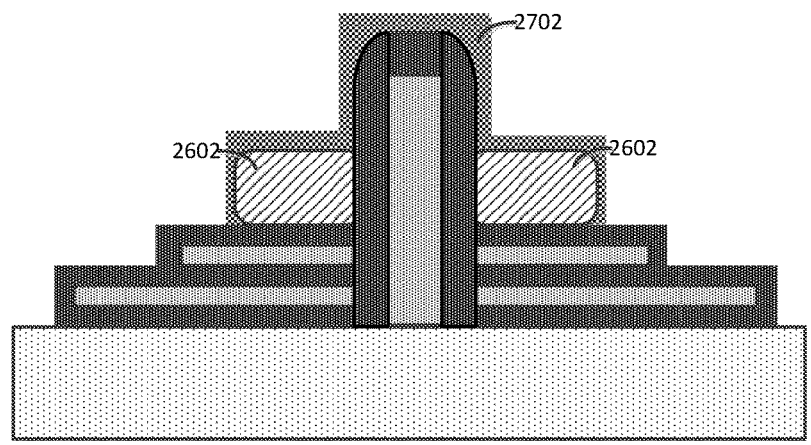

FIG. 27 illustrates the formation of a protective and sacrificial layer 2702 over exposed portions of the source/drain regions 2602. The sacrificial layer may include, for example, an oxide material.

Figure 28:
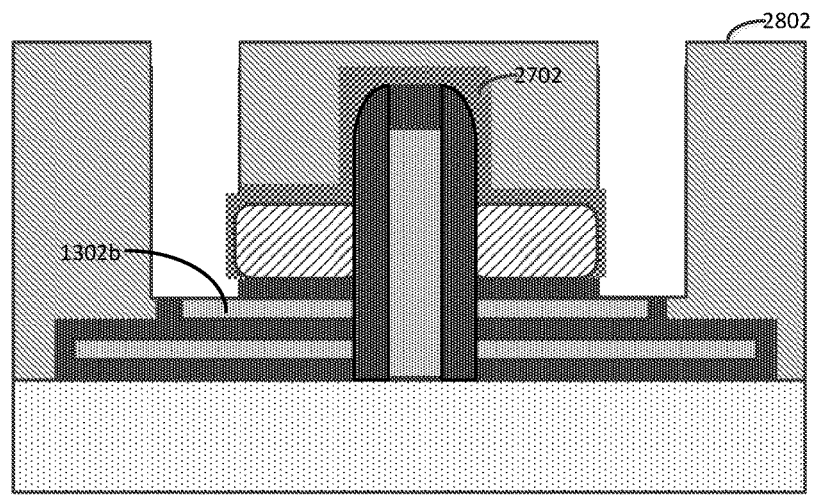

FIG. 28 illustrates a side view following the patterning of a mask 2802 and an etching process such as, for example, reactive ion etching that removes exposed portions of the spacer material 2402 and exposes portions of the nanowires 1502b.

Figure 29:
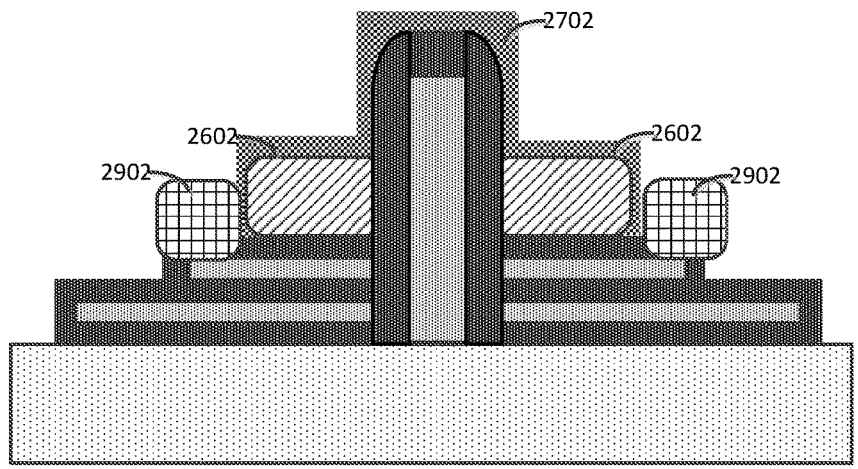

FIG. 29 illustrates a side view following the removal of the mask 3002 (of FIG. 28) and the growth of source/drain regions 2902. The mask may be removed by, for example, an ashing process. The source/drain regions 2902 may be grown by a suitable epitaxial growth process as described above.

The source/drain regions 2602 and the source/drain regions 2902 may include any suitable epitaxially grown semiconductor material and may include dissimilar materials. The source/drain regions 2602 and 2902 may include dissimilar types of dopants such that the source/drain regions 2602 form either a pFET or nFET device and the source/drain regions 2902 form either a pFET or nFET device.

Following the formation of the source drain regions 2602 and 2902 similar processes as described above in FIGS. 16-20 may be performed to substantially form a nanowire FET device having unmerged source/drain regions 2602 and 2902.

Figure 30:
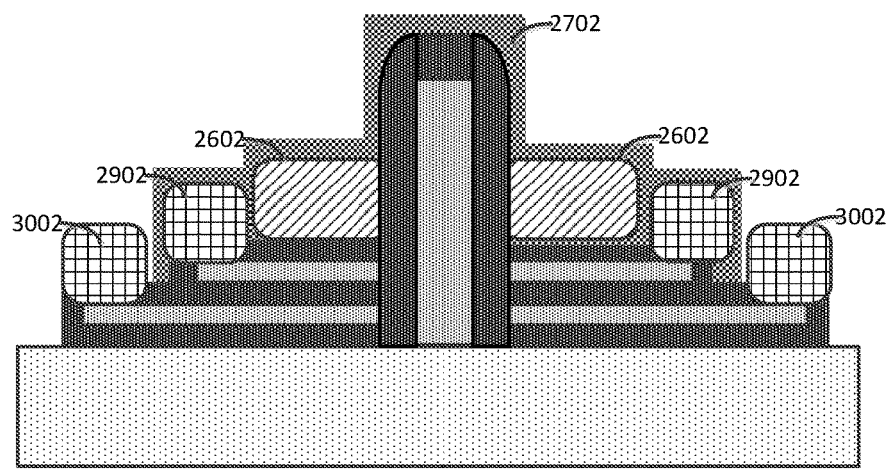

FIG. 30 illustrates a side view of the resultant structure following the formation of source/drain regions 3002. The source/drain regions 3002 are formed in a similar manner as the source/drain regions 2902 described above. The source/drain regions 3002 may include similar or dissimilar materials as the source/drain regions 2602 and/or 2902.

The methods and resultant structures described herein provide for a FET device having stacked substantially coplanar nanowires having different lengths, which may provide a number of different advantages including decreased external resistance and increased density of FET devices on a wafer.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A semiconductor device comprising:
    a stack of nanowires, the stack including:
        a first nanowire having a first length;
        a second nanowire having a second length, the second nanowire arranged above the first nanowire; and
        a third nanowire having a third length, the third nanowire arranged above the second nanowire;
    a gate stack arranged over channel regions of the first nanowire, the second nanowire, and the third nanowire;
    a first source/drain region attached on ends of the first nanowire;
    a second source/drain region attached on ends of the second nanowire; and
    a third source/drain region attached on ends of the third nanowire, wherein the first source/drain region, the second source/drain region, and the third source/drain region are formed of different materials, wherein the first nanowire has a length greater than a length of the second nanowire.

2. The device of claim 1, wherein the second nanowire has a length greater than a length of the third nanowire.

3. The device of claim 1, wherein the first, second, and third source/drain regions contacts the first, second, and third nanowires, respectively.

4. The device of claim 1, wherein:
    the first source/drain region is arranged on the first nanowire;
    the second source/drain region is arranged on the second nanowire; and
    the third source/drain region is arranged on the third nanowire.

5. The device of claim 1, wherein the first nanowire, the second nanowire, and the third nanowire include a semiconductor material.

* * * * *